(12) United States Patent
Washizu et al.

(10) Patent No.: US 8,294,357 B2
(45) Date of Patent: Oct. 23, 2012

(54) WAVELENGTH CONVERSION ELEMENT AND LIGHT EMITTING DEVICE

(75) Inventors: Takashi Washizu, Hino (JP); Takuji Hatano, Suita (JP); Yoshihito Taguchi, Amagasaki (JP)

(73) Assignee: Konica Minolta Opto, Inc., Tokyo (JP)

( * ) Notice: Subject to any disclaimer, the term of this patent is extended or adjusted under 35 U.S.C. 154(b) by 0 days.

(21) Appl. No.: 13/104,505

(22) Filed: May 10, 2011

(65) Prior Publication Data

US 2011/0279012 A1 Nov. 17, 2011

(30) Foreign Application Priority Data

May 12, 2010 (JP) ................................. 2010-109767

(51) Int. Cl.
*H01L 33/50* (2010.01)
*H01L 33/58* (2010.01)

(52) U.S. Cl. ........ 313/501; 313/483; 313/485; 313/512; 257/98; 257/100; 252/301.4 R

(58) Field of Classification Search .......... 313/498–512; 257/98–100; 252/301.4 R–301.4 H
See application file for complete search history.

(56) References Cited

U.S. PATENT DOCUMENTS

| 3,816,328 | A | * | 6/1974 | Levene | 252/301.6 S |
| 3,927,224 | A | * | 12/1975 | Levene | 252/301.6 S |
| 6,756,731 | B1 | * | 6/2004 | Sano | 313/499 |
| 2009/0072255 | A1 | * | 3/2009 | Takahashi et al. | 257/98 |
| 2009/0173957 | A1 | * | 7/2009 | Brunner et al. | 257/98 |
| 2009/0243467 | A1 | * | 10/2009 | Shimizu et al. | 313/503 |

FOREIGN PATENT DOCUMENTS

JP 2000-349347 12/2000
JP 4308620 5/2009

* cited by examiner

*Primary Examiner* — Mariceli Santiago
(74) *Attorney, Agent, or Firm* — Finnegan, Henderson, Farabow, Garrett & Dunner, L.L.P.

(57) ABSTRACT

A wavelength conversion element, including: a substrate; and a ceramic layer formed on the substrate, the ceramic layer being obtained by sintering a ceramic precursor; wherein the ceramic precursor is a compound selected from the group composed of alkoxysilane and a compound having a plurality of siloxane structures; a phosphor and particles of an oxide are mixed with the ceramic precursor; the phosphor has particle diameters within a range of from 1 μm to 50 μm and a concentration of the phosphor in the ceramic layer is equal to or more than 40 wt % and less than 95 wt %; and the particles of the oxide have primary particle diameters within a range of from 0.001 μm to 30 μm and a concentration within a range of from 0.5 wt % to 20 wt % in the ceramic layer.

5 Claims, 5 Drawing Sheets

FIG.4

Table 1

| SAMPLE | CONCENTRATION(WT%) | | LAYER THICKNESS (μm) | APPEARANCE EXAMINATION | LAYER STRENGTH |
|---|---|---|---|---|---|
| | PHOSPHOR | PARTICLES OF OXIDE | | | |
| COMPARATIVE EXAMPLE 1 | 90 | — | 30 | GOOD | BAD |
| COMPARATIVE EXAMPLE 2 | 63 | 30 | | GOOD | BAD |
| COMPARATIVE EXAMPLE 3 | 38 | 2 | | BAD | BAD |
| COMPARATIVE EXAMPLE 4 | 95 | 2 | | BAD | ACCEPTABLE |
| COMPARATIVE EXAMPLE 5 | 80 | 5 | | BEST | BAD |
| EXAMPLE 1 | 88 | 0.5 | | GOOD | ACCEPTABLE |
| EXAMPLE 2 | 87 | 2 | | GOOD | GOOD |
| EXAMPLE 3 | 94 | 2 | | ACCEPTABLE | GOOD |
| EXAMPLE 4 | 71 | 20 | | GOOD | ACCEPTABLE |
| EXAMPLE 5 | 85 | 4 | | BEST | BEST |
| EXAMPLE 6 | 85 | 4 | | GOOD | ACCEPTABLE |

FIG.5

Table 2

| | VISCOSITY (cp) | | 1 | 2 | 3 | 4 | 5 | STANDARD DEVIATION |
|---|---|---|---|---|---|---|---|---|
| COMPARATIVE EXAMPLE 5 | 3 | X VALUE | 0.32 | 0.35 | 0.338 | 0.321 | 0.313 | 0.0152 |
| | | Y VALUE | 0.347 | 0.352 | 0.354 | 0.32 | 0.335 | 0.0142 |
| EXAMPLE 2 | 12 | X VALUE | 0.324 | 0.328 | 0.32 | 0.34 | 0.32 | 0.0083 |
| | | Y VALUE | 0.327 | 0.33 | 0.335 | 0.32 | 0.33 | 0.0055 |
| EXAMPLE 5 | 20 | X VALUE | 0.327 | 0.324 | 0.331 | 0.333 | 0.327 | 0.0036 |
| | | Y VALUE | 0.335 | 0.33 | 0.328 | 0.33 | 0.332 | 0.0026 |

WAVELENGTH CONVERSION ELEMENT AND LIGHT EMITTING DEVICE

BACKGROUND OF THE INVENTION

1. Field of the Invention

The present invention relates to a wavelength conversion element and a light emitting device.

2. Description of Related Art

A light emitting device obtaining a white light by making a phosphor emit a light by means of a light from a light emitting diode (LED) element as an excitation light was hitherto developed in the uses of illumination and the like.

As such a light emitting device, for example, the following light emitting devices are known: one using a phosphor emitting a yellow light generated by being excited by a blue light emitted from an LED element to make a white light by mixing the color of each light with each other; one using a phosphor emitting a blue light, a green light, and a red light generated by being excited by an ultraviolet light emitted from an LED element to make a white light by mixing the three color lights emitted from the phosphor with one another; and the like.

Although a light emitting device made by directly sealing an LED chip with a hardening resin in which a phosphor is dispersed was developed as a configuration of such a light emitting device, the uses of the light emitting device have expanded to a region in which high luminance is required like a headlight of an automobile or the like, and now the heightening of the output power of white LED's has advanced to cause the heat generation of the LED chips. Consequently, if a phosphor is directly provided on an LED element in the form of being dispersed in a sealing medium as described above, the phosphor sometimes thermally deteriorates owing to the heat generated by the LED element.

A technique of preventing the deterioration of a sealing agent by dispersing a phosphor not into a resin but into a ceramic layer to seal an LED was proposed in order to settle such a problem (see, for example, Japanese Patent Application Laid-Open Publication No. 2000-349347). The ceramic layer is formed by mixing a phosphor into a precursor solution of the ceramic layer to bake the mixture.

However, the specific gravity of a phosphor is generally very large, e.g. about 4, and it is impossible to prevent the precipitation of the phosphor in the precursor solution of the ceramic layer. It is therefore impossible to uniformly disperse the phosphor in the ceramic layer. In the ceramic layer, the generation of a crack (the so-called breakage) is regarded as a problem, and it was also proposed to use ceramic powder and mix a phosphor with the ceramic powder for the purpose of preventing the crack. The countermeasure is however insufficient yet.

Furthermore, the technique disclosed in Japanese Patent Publication No. 4308620 (see paragraphs 0057-0059, FIG. 3, and the like) provides a wavelength conversion part (such as a luminescence conversion layer 4) at a position distant from a semiconductor device separately. In this form, because the wavelength conversion part is away from the semiconductor device, it is considered that the phosphor can be prevented from being thermally deteriorated by the heat generated by the semiconductor device.

However, even in such a form, because the specific gravity of the phosphor is large as described above, the phosphor precipitates when the phosphor is simply mixed with a precursor of the ceramic layer, and a uniform ceramic layer cannot be made.

Accordingly, the present inventor examined these techniques, and found that it was possible to prevent the precipitation of a phosphor to uniformly disperse the phosphor into a ceramic layer, by mixing fine particles of an oxide with the precursor solution of a ceramic layer (a liquid obtained by dissolving a ceramic precursor into a solvent) and by using alkoxysilane or a compound having a plurality of siloxane structures among the precursors.

However, although it was possible to obtain a good dispersion state of a phosphor by mixing fine particles of an oxide with a solution of alkoxysilane or a compound having a plurality of siloxane structures, it was found that a problem of the occurrence of a crack in the ceramic layer at the time of being baked and a problem of the exfoliation of the ceramic layer from a substrate supporting the ceramic layer were produced if the fine particles of the oxide were simply mixed. The smaller the fine particles of the oxide are, the larger the specific surface areas per unit weight are. Consequently, if the fine particles of the oxide are too much mixed, it becomes difficult to cover the surfaces of the fine particles with the ceramic precursor, and it is necessary to make sure the proper quantity of the mixing quantity of the fine particles of the oxide.

SUMMARY OF THE INVENTION

It is, therefore, a main object of the present invention to provide a wavelength conversion element and a light emitting device that can suppress the occurrence of a crack and the exfoliation of a ceramic layer.

According to an aspect of the present invention for settling the problems mentioned above, there is provided a wavelength conversion element including: a substrate; and a ceramic layer formed on the substrate, the ceramic layer being obtained by sintering a ceramic precursor; wherein the ceramic precursor is a compound selected from the group composed of alkoxysilane and a compound having a plurality of siloxane structures; a phosphor and particles of an oxide are mixed with the ceramic precursor; the phosphor has particle diameters within a range of from 1 μm to 50 μm and a concentration of the phosphor in the ceramic layer is equal to or more than 40 wt % and less than 95 wt %; and the particles of the oxide have primary particle diameters within a range of from 0.001 μm to 30 μm and a concentration within a range of from 0.5 wt %; to 20 wt % in the ceramic layer.

According to another aspect of the invention, there is provided a light emitting device including: an LED element emitting a light of a specific wavelength; and a wavelength conversion element receiving the light of the LED element to convert the wavelength; wherein the wavelength conversion element includes a substrate and a ceramic layer formed on the substrate, the ceramic layer being obtained by sintering a ceramic precursor; the ceramic precursor is a compound selected from the group composed of alkoxysilane and a compound having a plurality of siloxane structures; a phosphor and particles of an oxide are mixed with the ceramic layer; the phosphor has particle diameters within a range of from 1 μm to 50 μm and a concentration of the phosphor in the ceramic layer is equal to or more than 40 wt % and less than 95 wt %; and the particles of the oxide have primary particle diameters within a range of from 0.001 μm to 30 μm and a concentration within a range of from 0.5 wt % to 20 wt % in the ceramic layer.

According to the present invention, the particle diameters and the concentrations of the phosphor and the particles of an oxide are optimized, and consequently the phosphor is uniformly dispersed in the ceramic layer, and the occurrence of a crack of the ceramic layer and the exfoliation of the ceramic layer from the substrate can be suppressed.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein:

FIG. 4 is a table showing the results of the measurement of each concentration (wt %) of phosphors and fine particles of oxides in each of the whole ceramic layers; and FIG. 5 is a table showing the results of the measurements of chromaticities in two-dimensional directions (X direction and Y direction) of each cut piece when each selected cut piece is mounted on a blue LED and the LED is made to emit a light.

DESCRIPTION OF THE PREFERRED EMBODIMENTS

In the following, a preferable embodiment of the present invention will be described with reference to the accompanying drawings.

Figure 1:
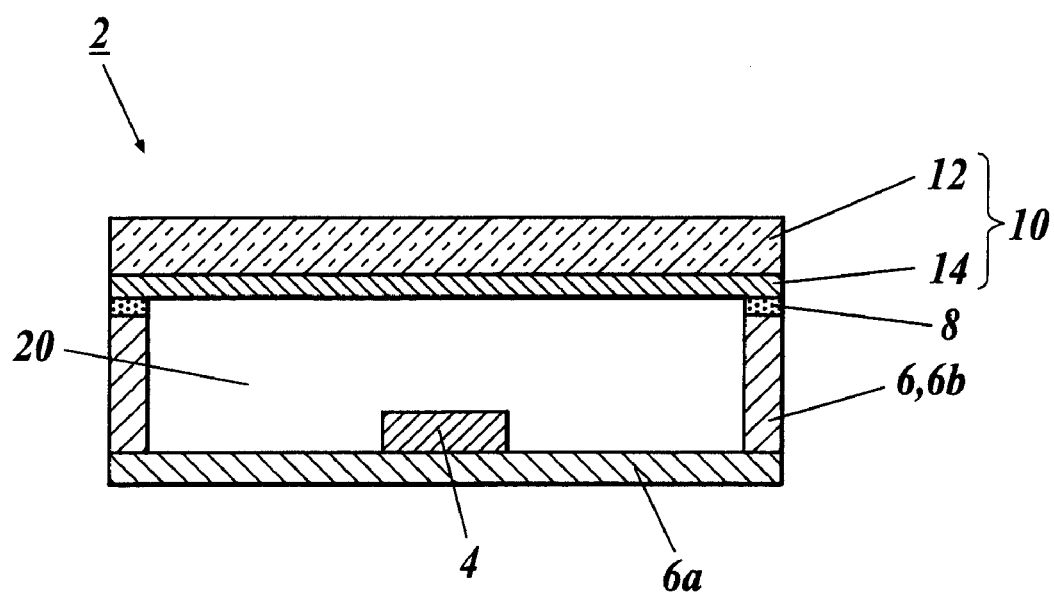
FIG. 1 is a sectional view showing the schematic configuration of a light emitting device.

As shown in FIG. 1, a light emitting device 2 includes an LED chip 4 emitting a light of a specific wavelength, an LED housing section 6 housing the LED chip 4 therein, and a wavelength conversion element 10 converting the wavelength of the light of the LED chip 4.

The LED chip 4 is an example of an LED element, and emits a light of a specific wavelength (a blue light in the present embodiment).

As the LED chip 4, a publicly known blue LED chip can be used.

As the blue LED chip, any existing LED chips including $In_xGa_{1-x}N$ based LED chips can be used. It is preferable that the emission peak wavelength of the blue LED chip is within a range of from 440 nm to 480 nm.

The wavelength of the light emitted by the LED chip 4 and the wavelength of the light emitted by the phosphor in the wavelength conversion element 10 are not limited. That is, any LED chip can be used as the LED chip 4 as long as the wavelength of the light emitted by the LED chip and the wavelength of the light emitted by the phosphor are a combination of being in a complementary color relation to each other and the light produced by synthesizing both the lights becomes a white light. However, in order to obtain the effect of the present invention, it is preferable that the wavelength of the light emitted by the LED chip 4 and the wavelength of the light emitted by the phosphor are each a visible light.

As the form of the LED chip 4, any form of an LED chip can be applied, such as a type of an LED chip mounted on a substrate to emit a light upward or sideward as it is, and the so-called flip-chip interconnection type, in which a blue LED chip is mounted on a transparent substrate, such as a sapphire substrate, and a bump is formed on a surface of the LED chip, following which the LED chip is turned over to be connected to the electrodes on the substrate. But, the flip-chip type one, which is more fitted to the manufacturing methods of a high luminance type one and a lens using type one, is more preferable.

The LED housing section 6 is chiefly composed of a substrate 6a and a side wall 6b to be almost in the shape of a box. The LED chip 4 is mounted on the central part of the substrate 6a. A mirror member made from, e.g., Al or Ag is preferably provided on the internal wall surface of the side wall 6b.

Although not especially limited, the LED housing section 6 is preferably made from a material that is excellent in light reflectivity and is difficult to deteriorate owing to the light from the LED chip 4.

The wavelength conversion element 10 is provided on the upper part of the LED housing section 6.

The wavelength conversion element 10 is mainly composed of a glass substrate 12 and a ceramic layer 14. The glass substrate 12 is made from a low-melting glass, a metallic glass, or the like. The glass substrate 12 may also be a substrate made from a resin. The ceramic layer 14 containing a phosphor is provided on the under surface of the glass substrate 12.

The ceramic layer 14 is basically a baked body of a mixture containing a ceramic precursor, a solvent, and a phosphor therein. Particles of an oxide are further added to the ceramic layer 14 of the present embodiment. In the following, the ceramic precursor (including the solvent), the phosphor, and the particles of the oxide will each be described in detail.

[Ceramic Precursor]

The ceramic precursor including the solvent is a solution containing a metallic compound.

The kind of the metal is not limited as long as the metal can form a ceramic having translucency.

The ceramic precursor is selected from (i) alkoxysilane and (ii) a compound having a plurality of siloxane structures.

The compound (ii) having the siloxane structures, here, indicates a compound in which two or more monomers each having the siloxane structure are coupled together.

The ceramic precursor solution can form a ceramic by being gelled by a reaction, such as hydrolysis, and after that, by being heated and baked in the gel state.

Alkoxysilane is preferable because it is easily gelled by hydrolysis and a polymerization reaction, and especially tetraethoxysilane is preferably used.

As a sol-gel solution used as the ceramic precursor solution, it is preferable to suitably contain water for hydrolysis, a solvent, a catalyst, and the like besides the metallic compounds mentioned above.

As the solvent, for example, alcohols, such as methanol, ethanol, propanol, and butanol, can be cited.

As the catalyst, for example, hydrochloric acid, sulfuric acid, nitric acid, acetic acid, fluorinated acid, and ammonia can be used.

Moreover, the heating temperature at the time of heating the gel is preferably within a range of from 150° C. to 700° C., and is more preferably within a range of from 150° C. to 500° C. from the point of view of suppressing the deterioration of the glass material and the like to be used as the substrate 6a.

[Phosphor]

The phosphor converts a light of a first predetermined wavelength emitted from the LED chip 4 into a light of a second predetermined wavelength. The present embodiment is adapted to convert a blue light emitted from the LED chip 4 into a yellow light.

As such a phosphor, a sintered body formed by being subjected to the following process of (A1) or (A2) and the following process of (B) is preferably used.

(A1): The oxides of Y, Gd, Ce, Sm, Al, La, and Ga, or compounds that are easily oxidized at high temperatures are sufficiently mixed at stoichiometric mixture ratios to obtain a mixed raw material.

(A2): Rare earth elements of Y, Gd, Ce, and Sm are dissolved in an acid at stoichiometric mixture ratios, and the solution is coprecipitated with oxalic acid. The coprecipitation oxide obtained by baking the coprecipitated solution, aluminium oxide, and gallium oxide are mixed with one another to obtain a mixed raw material.

(B): A proper quantity of fluoride of ammonium fluoride or the like is mixed as a flux with either of the mixed raw materials obtained by the processes of (A1) and (A2), and a compact is obtained by pressurizing the mixture. After that, the compact is stuffed in a crucible, and is baked in the air within a temperature range of from 1350° C. to 1450° C. for two to five hours. Thereby, a sintered body having a luminous characteristic of a phosphor can be obtained.

Although an yttrium aluminum garnet (YAG) phosphor is used in the present embodiment, the kind of the phosphor is not limited to the above-mentioned one. As the phosphor, another phosphor, such as a nongarnet series phosphor, not including Ce, can also be used.

The concentration of phosphor in the ceramic layer 14 (the ceramic layer 14 after being baked) is equal to or more than 40 wt % and less than 95 wt %, preferably equal to or more than 70 wt % and less than 95 wt %.

The larger the particle diameters of the phosphor are, the higher the luminous efficiency (wavelength conversion efficiency) thereof becomes. On the other hand, the larger the particle diameters are, the larger the gaps produced at interfaces between the particles and the organic metallic compound become, and the lower the film strength of the formed ceramic layer 14 becomes. Accordingly, the phosphor having an average particle diameter within a range of from 1 μm to 50 μm is preferably used in consideration of the luminous efficiency and the sizes of the gaps formed at the interfaces between the phosphor and the organic metallic compound. The average particle diameter of the phosphor can be measured by, for example, the Coulter Counter method.

[Particles of Oxide]

The particles of an oxide not only have a thickening effect of increasing the viscosity of a mixture, but also have a filling-up effect of filling up the gaps produced at the interfaces of the organic metallic compound and the phosphor, and a film oxidization effect of improving the film strength of the ceramic layer 14 after being heated.

As the particles of the oxide to be used for the present invention, particles of silicon oxide, titanium oxide, zinc oxide, and the like can preferably be cited. In particular, in the present invention, it is preferable to use particles of silicon oxide as the particles of the oxide from the point of view of the stability of the particles to the ceramic layer 14 to be formed.

The concentration of the particles of the oxide in the ceramic layer 14 (the ceramic layer after being baked) is within a range of from 0.5 wt % to 20 wt %, preferably within a range of from 4 wt % to 10 wt %.

If the concentration of the particles of the oxide becomes less than 0.5 wt %, the aforesaid effects cannot sufficiently be obtained. On the other hand, if the contained quantity of the particles of the oxide exceeds 20 wt %, the strength of the ceramic layer 14 after being heated falls.

It is necessary to use the particles of the oxide having the central particle diameter of the primary particle diameters within a range of from 0.001 μm to 30 μm in consideration of the effects mentioned above. The central particle diameter of the primary particle diameters of the particles of the oxide can be measured by the Coulter counter method, for example.

The surfaces of the particles of the oxide may be processed by a silane coupling agent or a titanate coupling agent in consideration of the compatibility of the particles with the ceramic precursor and the organic solvent.

However, the carbon content rate of the particles of the oxide is preferably made to be 10 wt % or less in the ceramic layer 14 inclusively of this case (in both of the cases of being subjected to the surface processing and not being subjected to the surface processing). When the carbon content rate of the particles of the oxide exceeds 10 wt %, there is a possibility of the occurrence of a problem of the coloring at the time of sintering.

The thickness of the ceramic layer 14 is preferably within a range of from 5 μm to 200 μm.

Although the lower limit value of the thickness of the ceramic layer 14 is not limited, the permeation prevention effect of moisture can be obtained when the thickness of the ceramic layer 14 is thicker than that of the phosphor particles, and the deterioration of the phosphor particles can be suppressed.

The reason why the upper limit value of the thickness of the ceramic layer 14 is 200 μm is that there is a possibility that cracks are generated in the ceramic layer 14 when the thickness exceeds the value, and that the upper limit value is set for preventing the generation of the cracks.

In the light emitting device 2, an adhesive 8 is coated on the upper part of the side wall 6b of the LED housing section 6, and the wavelength conversion element 10 is adhered to the side wall 6b. As a result, an enclosed space 20 is formed in a region enclosed by the LED housing section 6 and the ceramic layer 14, and the LED chip 4 is contained in the enclosed space 20. Hence, the deterioration of the LED chip 4 owing to the oxygen and humidity in the open air is suppressed.

The enclosed space 20 is preferably formed to be a low refractive index layer having a lower refractive index than that of the glass substrate 12. As the low refractive index layer, for example, a gas layer with a gas filled up therein, an air layer, or a resin layer is preferable. As the gas layer, for example, a gas, such as a nitrogen gas, is preferably purged. By forming the gas layer as the low refractive index layer, a light emitted from the phosphor to the side of the glass substrate 12 is easily totally reflected on the internal wall surface of the side wall 6b of the LED housing section 6, and the arrangement becomes the one in which the utilization efficiency of a light emitted from the phosphor is high.

Figure 2:
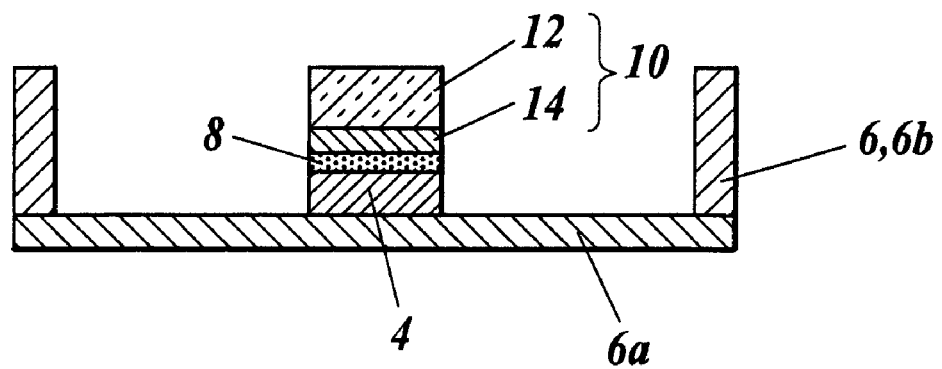
FIG. 2 is a view showing a modification of the light emitting device of FIG. 1.

In the light emitting device 2, as shown in FIG. 2, the adhesive 8 may directly be coated onto the LED chip 4 to adhere the wavelength conversion element 10 thereto.

Successively, the operation of the light emitting device 2 will simply be described.

First, when the LED chip 4 emits a blue light to the outside, the blue light enters the phosphor in the ceramic layer 14. Then, a yellow light is emitted from the phosphor excited by the blue light. As a result, the blue light and the yellow light generated by the phosphor are superposed on each other to be a white light to be emitted to the outside of the LED housing section 6.

The light emitting device 2 mentioned above can suitably be used as a headlight for an automobile.

Successively, a manufacturing method of the light emitting device 2 will simply be described.

First, a ceramic precursor, a solvent, and a phosphor are mixed with one another, and particles of an oxide are added to the mixture. In this case, the concentration of the particles of the oxide is adjusted to make the viscosity of the mixture to be within a range of from 1 cp to 1000 cp, preferably within a range of from 5 cp to 200 cp.

After that, the ceramic layer 14 is formed by coating the mixture, to which the particles of the oxide is added, onto the glass substrate 12 to bake the coating at a certain temperature and for a certain time.

When the mixture is coated on the glass substrate 12, any coating technique can be used, and for example, the following coating techniques (i)-(iii) can suitably be used.

(i) Applicator (Blade)

The mixture can be coated on the glass substrate 12 by using a publicly known applicator. For example, as a concrete applicator, Baker Applicator manufactured by Kodaira Seisakusyo Co., Ltd. can be used.

If an applicator is used, the moving speed of the applicator is preferably set to be within a range of from 0.1 m/min. to 3.0 m/min.

(ii) Spin Coater

The mixture can be coated on the glass substrate 12 by using a publicly known spin coater. For example, as a concrete spin coater, Spin Coater MS-A 100 manufactured by Mikasa Co., Ltd. can be used.

If the spin coater is used, the rotation speed is preferably set to be within a range of from 1000 rpm to 3000 rpm, and the rotation time is preferably set to be within a range of from 5 sec. to 20 sec.

(iii) Spray Coating Device

Figure 3:
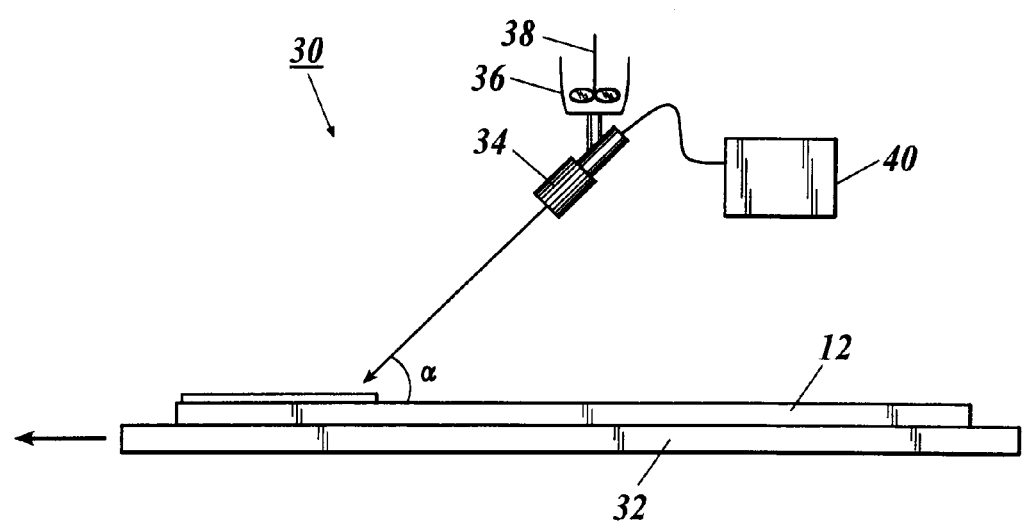
FIG. 3 is a view showing the schematic configuration of a spray coating device.

The mixture can be coated on the glass substrate 12 by using the spray coating device 30 of FIG. 3.

As shown in FIG. 3, the spray coating device 30 includes a movable pedestal 32. The glass substrate 12 is installed on the pedestal 32. A nozzle 34 ejecting the mixture is provided above the pedestal 32. A tank 36 for reserving the mixture is connected to the nozzle 34. A stirring mechanism 38 for stirring the mixture is installed in the tank 36. A compressor 40 for sending the mixture into the nozzle 34 to make the mixture be ejected from the nozzle 34 is connected to the nozzle 34.

For example, a spray gun W-101-142 BPG manufactured by Anest Iwata Corp. can be used as the concrete nozzle 34, and PC-51 manufactured by Anest Iwata Corp. can be used as the concrete tank 36, and OFP-071C manufactured by Anest Iwata Corp. can be used as the concrete compressor 40.

When the mixture is actually coated on the glass substrate 12 by using the spray coating device 30, the pedestal 32 is moved while the mixture is being ejected from the nozzle 34 by the compressor 40 in the state in which the mixture in the tank 36 is being stirred by the stirring mechanism 38. Thereby, the mixture is coated on the glass substrate 12 while the coating position of the mixture is being changed.

In this case, the moving speed of the pedestal 32 is preferably set to be within a range of from 10 mm/sec to 60 mm/sec.

If the moving speed of the pedestal 32 is set within the range of from 10 mm/sec to 60 mm/sec, the mixture can uniformly be coated on the glass substrate 12.

The ejection angle α of the nozzle 34 to the glass substrate 12 is preferably set within a range of from 30° to 60°.

The longer the distance between the glass substrate 12 and the nozzle 34 is, the more the mixture can be coated uniformly. However, because the film strength of the ceramic layer 14 has also a tendency to fall, the distance between the glass substrate 12 and the nozzle 34 is preferably set to be within a range of from 3 cm to 30 cm.

The distance between the glass substrate 12 and the nozzle 34 can be adjusted within the range mentioned above in consideration of the pressure of the compressor 40. In the present embodiment, the pressure of the compressor 40 can be adjusted in order that the pressure at the jetting port of the nozzle 34 may be, for example, 0.14 MPa.

In the coating technique described above, the thickness of coating can be made to be uniform by adjusting the viscosity of the mixture to be 1 cp or more.

If the viscosity of the mixture is adjusted to be within a range of from 10 cp to 1000 cp, the coating by the spray coating method of (iii) described above becomes possible, and the coating having a uniform thickness of coating becomes possible.

If the viscosity of the mixture exceeds 1000 cp, the irregularities of the mixture and movement traces (stripes) of the applicator remain after the coating thereof, and there is a possibility that the uniformity of the thickness of the coating of the mixture decreases. Accordingly, the viscosity of the mixture is preferably set to be 1000 cp or less.

After that, the glass substrate 12 on which the ceramic layer 14 is formed is diced (cut off) into pieces each formed in a polygon (for example, a quadrilateral) having one side of about 5 mm, and a plurality of wavelength conversion elements 10 is thus manufactured. After that, the adhesive 8 is coated onto the LED housing section 6 to which the LED chip 4 is mounted beforehand, and the wavelength conversion element 10 is adhered thereto.

According to the present embodiment described above, the particle diameters and the concentrations of the phosphor and the particles of the oxide are optimized in the ceramic layer 14, and consequently the phosphor is uniformly dispersed into the ceramic layer 14. Furthermore, the occurrence of a crack of the ceramic layer 14 and the occurrence of the exfoliation of the ceramic layer 14 from the glass substrate 12 can be suppressed (see the following examples).

EXAMPLES (1) Making Samples

With an aim of manufacturing a plurality of light emitting devices 2 each having the configuration essentially same as that of FIG. 1, the configuration (the concentrations and the like of the phosphor and the particles of the oxide) of the ceramic layer 14 of each device 2 was changed.

The details of each configuration were as follows.

(1.1) LED Chip

A blue LED chip of a size of 1000 μm×1000 μm×100 μm was used, and the blue LED chip was mounted onto a mount member by flip chip mounting.

(1.2) Preparation of Phosphor

A mixture mixing the following phosphor raw materials was sufficiently filled up in an aluminum crucible, and a proper quantity of a fluoride, such as ammonium fluoride, was mixed into the mixture as a flux. Then, the mixture was baked within a temperature range of from 1350° C. to 1450° C. for 2-5 hours in a reducing atmosphere through which a hydrogen containing nitrogen gas was being circulated to obtain a baked product $((Y_{0.72}Gd_{0.24})_3Al_5O_{12}:Ce_{0.04})$.

$Y_2O_3$ . . . 7.41 g
$Gd_2O_3$ . . . 4.01 g
$CeO_2$ . . . 0.63 g
$Al_2O_3$ . . . 7.77 g

After that, the obtained baked product was subjected to pulverization, cleaning, separation, and drying to obtain a desired "phosphor A." By performing the pulverization of the obtained phosphor A, the phosphor A was made to phosphor particles each having a particle diameter of about 10 μm, and the phosphor particles were used.

An examination of the composition of the phosphor A made it possible to confirm that the phosphor A was a desired phosphor, and an examination of the wavelength of an emitted light in an excitation light having a wavelength of 465 nm made it clear that the emitted light has a peak wavelength of about 570 nm.

(1.3) Wavelength Conversion Element (1.3.1) Comparative Example 1

1.2 g of the phosphor A was mixed into 1.8 g of "polysiloxane dispersion liquid B (14 wt % of polysiloxane and 86 wt % of isopropyl alcohol)" to make a liquid mixture.

After that, the liquid mixture was coated onto a glass substrate sized in 100 mm×100 mm×1 mm by the bar-coating method with a spacer sheet of 100 μm, and the glass substrate was baked at 500° C. for one hour to be a sample of the "comparative example 1."

In the sample of the comparative example 1, the concentration of the phosphor A in the ceramic layer 14 was 90 wt %, and the layer thickness of the ceramic layer was 30 μm.

(1.3.2) Comparative Example 2

0.6 g of the phosphor A and 0.29 g of "fine particles of an oxide C" (Nano Tek Powder, $SiO_2$, manufactured by CIK Nano Tek Corporation; primary particle diameter: 25 nm) were mixed into 1 g of the polysiloxane dispersion liquid B to make a liquid mixture.

After that, a sample of a "comparative example 2" was made by the processing similar to that of the comparative example 1.

In the sample of the comparative example 2, the concentration of the phosphor A in the ceramic layer 14 was 63 wt %; the concentration of the fine particles of the oxide C in the ceramic layer 14 was 30 wt %; and the layer thickness of the ceramic layer 14 was 30 μm.

(1.3.3) Comparative Example 3

0.53 g of the phosphor A and 0.003 g of the fine particles of the oxide C were mixed into 5 g of the polysiloxane dispersion liquid B to make a liquid mixture.

After that, a sample of a "comparative example 3" was made by the processing similar to that of the comparative example 1.

In the sample of the comparative example 3, the concentration of the phosphor A in the ceramic layer 14 was 38 wt %; the concentration of the fine particles of the oxide C was 2 wt %; and the layer thickness of the ceramic layer 14 was 30 μm.

(1.3.4) Comparative Example 4

1.2 g of the phosphor A and 0.025 g of the fine particles of the oxide C were mixed into 0.035 g of the polysiloxane dispersion liquid B to make a liquid mixture.

After that, a sample of a "comparative example 4" was made by the processing similar to that of the comparative example 1.

In the sample of the comparative example 4, the concentration of the phosphor A in the ceramic layer 14 was 95 wt %; the concentration of the fine particles of the oxide in the ceramic layer 14 was 2 wt %; and the layer thickness of the ceramic layer 14 was 30 μm.

(1.3.5) Comparative Example 5

0.8 g of the phosphor A and 0.05 g of particles of an oxide (RX 300 manufactures by Nippon Aerosil Co., Ltd.; particle diameter: 7 nm) were mixed into 0.75 g of polysilazane solution (MN 120, 20 wt %, manufactured by AZ Electronic Materials K. K.) to make a liquid mixture. The viscosity of the liquid mixture was 3 cp. An oscillating viscometer (VM-10A-L manufactured by CBC Co., Ltd.) was used as the measuring apparatus.

After that, a sample of a "comparative example 5" was made by the processing similar to that of the comparative example 1 except that the baking temperature was set to 350° C., and that the baking time was set to 180 minutes.

In the sample of the comparative example 5, the concentration of the phosphor A in the ceramic layer 14 was 80 wt %; the concentration of the fine particles of the oxide in the ceramic layer 14 was 5 wt %; and the layer thickness of the ceramic layer 14 was 30 μm.

(1.3.6) Example 1

0.53 g of a phosphor A and 0.003 g of the fine particles of the oxide C were mixed into 1 g of the polysiloxane dispersion liquid B to make a liquid mixture.

After that, a sample of an "example 1" was made by the processing similar to that of the comparative example 1.

In the sample of the example 1, the concentration of the phosphor A in the ceramic layer 14 was 88 wt %; the concentration of the fine particles of the oxide C in the ceramic layer 14 was 0.5 wt %; and the layer thickness of the ceramic layer 14 was 30 μm.

(1.3.7) Example 2

0.53 g of the phosphor A and 0.012 g of the fine particles of the oxide C were mixed into 1 g of the polysiloxane dispersion liquid B to make a liquid mixture. The viscosity of the liquid mixture was 12 cp. The oscillating viscometer (VM-10A-L manufactured by CBC Co., Ltd.) was used as the measuring apparatus.

After that, a sample of an "example 2" was made by the processing similar to that of the comparative example 1.

In the sample of the example 2, the concentration of the phosphor A in the ceramic layer 14 was 87 wt %; the concentration of the fine particles of the oxide C in the ceramic layer 14 was 2 wt %; and the layer thickness of the ceramic layer 14 was 30 μm.

(1.3.8) Example 3

0.53 g of the phosphor A and 0.012 g of the fine particles of the oxide C were mixed into 0.3 g of the polysiloxane dispersion liquid B to make a liquid mixture.

After that, a sample of an "example 3" was made by the processing similar to that of the comparative example 1.

In the sample of the example 3, the concentration of the phosphor A in the ceramic layer 14 was 94 wt %; the concentration of the fine particles of the oxide C in the ceramic layer 14 was 2 wt %; and the layer thickness of the ceramic layer 14 was 30 μm.

(1.3.9) Example 4

0.6 g of the phosphor A and 0.17 g of the fine particles of the oxide C were mixed into 1 g of the polysiloxane dispersion liquid B to make a liquid mixture.

After that, a sample of an "example 4" was made by the processing similar to that of the comparative example 1.

In the sample of the example 4, the concentration of the phosphor A in the ceramic layer 14 was 71 wt %; the concentration of the fine particles of the oxide C in the ceramic layer 14 was 20 wt %; and the layer thickness of the ceramic layer 14 was 30 μm.

(1.3.10) Example 5

0.6 g of the phosphor A and 0.03 g of the fine particles of the oxide C were mixed into 1 g of the polysiloxane dispersion liquid B to make a liquid mixture. The viscosity of the liquid mixture was 20 cp. The oscillating viscometer (VM-10A-L made of CBC Co., Ltd.) was used as the measuring apparatus.

After that, a sample of an "example 5" was made by the processing similar to that of the comparative example 1.

In the sample of the example 5, the concentration of the phosphor A in the ceramic layer 14 was 85 wt %; the concentration of the fine particles of the oxide C in the ceramic layer 14 was 4 wt %; and the layer thickness of the ceramic layer 14 was 30 μm.

(1.3.11) Example 6

0.24 g of tetraethoxysilane, 0.25 g of ethanol, and 0.05 g of water were mixed together to make a tetraethoxysilane solution. 0.6 g of the phosphor A and 0.03 g of the fine particles of the oxide C were mixed into this tetraethoxysilane solution to make a liquid mixture. The viscosity of the liquid mixture was 10 cp.

After that, a sample of an "example 6" was made by the processing similar to that of the comparative example 1 except for baking the liquid mixture at 500° C. for one hour after heating the liquid mixture at 50° C. for 30 minutes.

In the sample of the example 6, the concentration of the phosphor A in the ceramic layer 14 was 85 wt %; the concentration of the fine particles of the oxide C in the ceramic layer 14 was 4 wt %; and the layer thickness of the ceramic layer 14 was 30 μm.

(2) Evaluation of Samples (2.1) Measurement of Phosphor Concentration

A sample was scraped off from a measuring position of each ceramic layer 14, and the concentrations (wt %) of the phosphor in the whole ceramic layer 14 and the fine particles of the oxide were measured. The measurement results are shown in table 1 of FIG. 4.

An energy dispersive X-ray fluorescence analysis apparatus (EDX) was used as the measuring apparatus.

(2.2) Measurements of Thicknesses

A measuring position of each ceramic layer 14 was scraped, and the heights (difference) before and after the scraping were measured. The measurement results are shown in the table 1.

A measuring microscope MF-A505H manufactured by Mitutoyo Corporation was used as the measuring apparatus.

(2.3) Appearance Examination

The external appearance of each sample sized in 100 mm×100 mm was observed with a microscope to examine the existence of the occurrence of a crack and the extent of the crack. The examination results are shown in the table 1.

The evaluative standards of "BEST", "GOOD", "ACCEPTABLE" and "BAD", in the table 1, are as follows.

"BEST": there is no occurrence of a crack

"GOOD": some minute cracks in the extent of causing no troubles in actual uses are found "ACCEPTABLE": cracks in the extent of causing no troubles in actual uses are found "BAD": cracks and layer exfoliation are found (2.4) Measurement of Layer Strength Each sample (each ceramic layer 14 after being baked) was cut to be a size of 5 mm×5 mm, and further tessellated cuts of 5 (rows)×5 (columns) were made into the surface of each sample. The size of each obtained cut piece was 1 mm×1 mm. After that, a piece of Nichiban Tape was stuck to the surface of each of the obtained 25 samples to exfoliate the surface. The number of the exfoliated sheets was measured, and the layer strength of each sheet was evaluated. The results of the evaluations are shown in the table 1.

The evaluative standards of "BEST", "GOOD", "ACCEPTABLE" and "BAD", in the table 1, are as follows.

"BEST": there is no exfoliation

"GOOD": there are one to three sheets of exfoliation

"ACCEPTABLE": there are four to ten sheets of exfoliation

"BAD": eleven or more sheets of exfoliation (2.5) Measurements of Chromaticities Each sample (glass substrate sized in 100 mm×100 mm) of the comparative example 5 and the examples 2 and 5 was cut off into a grid by the size of 5 mm×5 mm, and five cut pieces were arbitrarily selected among the cut pieces.

Each selected cut piece was mounted on a blue LED, and the chromaticities in two-dimensional directions (X direction and Y direction) of each cut piece when the LED emitted a light were measured. A spectral radiance meter CS-1000A manufactured by Konica Minolta Sensing, Inc. was used as the measuring apparatus. After that, standard deviations were calculated from measured values, and the uniformities of the chromaticities were compared and evaluated. It was supposed as an index of the evaluations that the dispersion of chromaticities had no problems practically when each standard deviation was equal to or less than 0.01. The results are shown in a table 2 of FIG. 5.

(3) Conclusion

As shown in the table 1, the concentrations of the fine particles of the oxides of the samples of the comparative examples 1 and 2 were not within a range of from 5 wt % to 20 wt %, and their layer strengths were inferior.

The concentrations of the phosphors of the samples of the comparative examples 3 and 4 were not within the range of from 40 wt % to 90 wt %. Cracks were caused, and their layer strengths were also inferior.

The sample of the comparative example 5 used polysilazane as its ceramic precursor, and few cracks were produced. But the dispersibility of the fine particles of the oxide was insufficient, and consequently its layer strength was inferior.

On the other hand, as for the samples of the examples 1-6, the concentrations of the phosphors were within the ranges of from 40 wt % to 95 wt %, and the concentrations of the fine particles of the oxides were within the range of from 0.5 wt % to 20 wt %. Good results were capable of being obtained. In particular, in the sample of the example 5, the best results were capable of being obtained.

From the examinations mentioned above, it was found that the setting of the concentration of a phosphor to be within a range of from 40 wt % to 95 wt % and the setting of the concentration of the particles of an oxide to be within a range of from 0.5 wt % to 20 wt % were useful for suppressing the occurrence of the cracks of a ceramic layer and the occurrence of the exfoliation from the glass substrate of a ceramic layer.

Moreover, as shown in the table 2, because the sample of the comparative example 5 used polysilazane as its ceramic precursor, the dispersibility of the fine particles of an oxide was insufficient, and the viscosity thereof fell. Consequently, the sample was not capable of obtaining good uniformity (there was dispersion in the chromaticity).

On the other hand, the samples of the examples 2 and 5 were capable of obtaining good uniformity, and the sample 5 having high viscosity was especially capable of obtaining good results.

The entire disclosure of Japanese Patent Application No. 2010-109767 filed on May 12, 2010 including description, claims, drawings, and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A wavelength conversion element, comprising:
a substrate; and
a ceramic layer formed on the substrate, the ceramic layer being obtained by sintering a ceramic precursor; wherein
the ceramic precursor is a compound selected from the group composed of alkoxysilane and a compound having a plurality of siloxane structures;
a phosphor and particles of an oxide are mixed with the ceramic precursor;
the phosphor has particle diameters within a range of from 1 µm to 50 µm and a concentration of the phosphor in the ceramic layer is equal to or more than 40 wt % and less than 95 wt %; and
the particles of the oxide have primary particle diameters within a range of from 0.001 µm to 30 µm and a concentration within a range of from 0.5 wt % to 20 wt % in the ceramic layer.

2. The wavelength conversion element according to claim 1, wherein a thickness of the ceramic layer is within a range of from 5 µm to 200 µm.

3. A light emitting device, comprising:
an LED element emitting a light of a specific wavelength; and
a wavelength conversion element receiving the light of the LED element to convert the wavelength; wherein
the wavelength conversion element includes a substrate and a ceramic layer formed on the substrate, the ceramic layer being obtained by sintering a ceramic precursor;
the ceramic precursor is a compound selected from the group composed of alkoxysilane and a compound having a plurality of siloxane structures;
a phosphor and particles of an oxide are mixed with the ceramic layer;
the phosphor has particle diameters within a range of from 1 µm to 50 µm and a concentration of the phosphor in the ceramic layer is equal to or more than 40 wt % and less than 95 wt %; and
the particles of the oxide have primary particle diameters within a range of from 0.001 µm to 30 µm and a concentration within a range of from 0.5 wt % to 20 wt % in the ceramic layer.

4. The light emitting device according to claim 3, wherein a thickness of the ceramic layer is within a range of from 5 µm to 200 µm.

5. The light emitting device according to claim 3, wherein a carbon content rate of the particles of the oxide is 10 wt % or less.

* * * * *